US010557905B2

United States Patent
Ng et al.

(10) Patent No.: US 10,557,905 B2
(45) Date of Patent: Feb. 11, 2020

(54) SYSTEM AND METHOD FOR PRODUCING HIGH-RESOLUTION MAGNETIC RELAXATION PARAMETER MAPS

(71) Applicant: Northwestern University, Evanston, IL (US)

(72) Inventors: Jason Ng, Evanston, IL (US); Paras Parikh, Chicago, IL (US); Timothy J. Carroll, Chicago, IL (US); Daniel C. Lee, Chicago, IL (US)

(73) Assignees: Northwestern University, Evanston, IL (US); The Board of Trustees of the University of Illinois, Urbana, IL (US)

( * ) Notice: Subject to any disclaimer, the term of this patent is extended or adjusted under 35 U.S.C. 154(b) by 22 days.

(21) Appl. No.: 16/066,278

(22) PCT Filed: Jan. 9, 2017

(86) PCT No.: PCT/US2017/012677
§ 371 (c)(1),
(2) Date: Jun. 26, 2018

(87) PCT Pub. No.: WO2017/120567
PCT Pub. Date: Jul. 13, 2017

(65) Prior Publication Data
US 2019/0025393 A1 Jan. 24, 2019

Related U.S. Application Data

(60) Provisional application No. 62/276,572, filed on Jan. 8, 2016.

(51) Int. Cl.
*G01R 33/44* (2006.01)
*G01R 33/56* (2006.01)
(Continued)

(52) U.S. Cl.
CPC ....... *G01R 33/5602* (2013.01); *G01R 33/443* (2013.01); *G01R 33/483* (2013.01); *G01R 33/50* (2013.01); *G01R 33/58* (2013.01)

(58) Field of Classification Search
CPC .................. G01R 33/5602; G01R 33/443
(Continued)

(56) References Cited

U.S. PATENT DOCUMENTS 7,642,775 B2 * 1/2010 Katscher ................ G01R 33/50
324/307
9,002,428 B2 4/2015 Mazer et al.
(Continued)

OTHER PUBLICATIONS

Castets, et al., Fast and Robust 3D T1 Mapping Using Spiral Encoding and Steady RF Excitation at 7T: Application to Cardiac Manganese Enhanced MRI (MEMRI) in Mice, NMR in Biomedicine, 2015, 28(7):881-889.
(Continued)

*Primary Examiner* — Reena Aurora
(74) *Attorney, Agent, or Firm* — Quarles & Brady LLP

(57) ABSTRACT

Described here are systems and methods for producing high-resolution three-dimensional ("3D") relaxation parameter maps by calibrating high-resolution 3D magnetic resonance images. As one example, high-resolution longitudinal relaxation time ("T1") maps can be generated based on images acquired using a T1-weighted pulse sequence, and as another example high-resolution transverse relaxation time ("T2") maps can be generated based on images acquired using a T2-weighted pulse sequence. The high-resolution images can be calibrated, for example, using a lower resolution single slice relaxation parameter map. The methods described here utilize high-resolution 3D scans and low-resolution relaxation parameter maps that are commonly available on MRI systems. The calibration is a post-pro-
(Continued)

cessing step used to create the high-resolution 3D relaxation parameter maps from these two types of scans.

19 Claims, 4 Drawing Sheets

(51) Int. Cl.
  *G01R 33/58* (2006.01)
  *G01R 33/483* (2006.01)
  *G01R 33/50* (2006.01)
(58) Field of Classification Search
  USPC .......................................................... 324/307
  See application file for complete search history.

(56) References Cited

U.S. PATENT DOCUMENTS

| | | | |
|---|---|---|---|
| 9,052,372 B2* | 6/2015 | Palma ..................... | G01R 33/50 |
| 2011/0224962 A1 | 9/2011 | Goldberger et al. | |
| 2012/0194186 A1* | 8/2012 | Rehwald ................ | G01R 33/50 |
| | | | 324/309 |
| 2014/0292330 A1 | 10/2014 | Gulani et al. | |
| 2015/0268320 A1 | 9/2015 | Akcakaya et al. | |
| 2015/0309146 A1 | 10/2015 | Jin et al. | |
| 2017/0176563 A1* | 6/2017 | Yablonskiy .......... | G01R 33/246 |

OTHER PUBLICATIONS

Chen, et al., Rapid Volumetric T1 Mapping of the Abdomen Using 3D Through-Time Spiral GRAPPA, Magnetic Resonance in Medicine, 2016, 75(4):1457-1465.

Freeman, et al., Optimization of the Ultrafast Look-Locker Echo-Planar Imaging T1 Mapping Sequence, Magnetic Resonance Imaging, 1998, 16(7):765-772.

Jivan, et al., Dynamic T1 Measurement Using Snapshot-FLASH MRI, Journal of Magnetic Resonance, 1997, 127(1):65-72.

Kvernby, et al., Simultaneous Three-Dimensional Myocardial T1 and T2 Mapping in One Breath Hold With 3D-QALAS, Journal of Cardiovascular Magnetic Resonance, 2014, 16:102, 14 pages.

Marty, et al., Bloch Equations-Based Reconstruction of Myocardium T1 Maps from Modified Look-Locker Inversion Recovery Sequence, PLoS ONE, 2015, 10(5):e0126766, 17 pages.

Messroghli, et al., Modified Look-Locker Inversion Recovery (MOLLI) for High-Resolution T1 Mapping of the Heart, Magnetic Resonance in Medicine, 2004, 52:141-146.

Peeters, et al., Inflow Correction of Hepatic Perfusion Measurements Using T1-Weighted, Fast Gradient-Echo, Contrast-Enhanced MRI, Magnetic Resonance in Medicine, 2004, 51:710-717.

Raman, et al., Modified Look-Locker Inversion Recovery T1 Mapping Indices: Assessment of Accuracy and Reproducibility Between Magnetic Resonance Scanners, Journal of Cardiovascular Magnetic Resonance, 2013, 15:64, 10 pages.

Weingartner, et al., Free-Breathing Combined 3D Phase Sensitive Late Gadolinium Enhancement and T1 Mapping for Myocardial Tissue Characterization, Magnetic Resonance in Medicine, 2015, 74(4):1032-1041.

Weingartner, et al., Free-Breathing Post-Contrast Three-Dimensional T1 Mapping: Volumetric Assessment of Myocardial T1 Values, Magnetic Resonance in Medicine, 2015, 73(1):214-222.

Zhang, et al., Accelerating Parameter Mapping with a Locally Low Rank Constraint, Magnetic Resonance in Medicine, 2015, 73:655-661.

PCT International Search Report and Written Opinion, PCT/US2017/12677, dated Apr. 7, 2017, 17 pages.

* cited by examiner

SYSTEM AND METHOD FOR PRODUCING HIGH-RESOLUTION MAGNETIC RELAXATION PARAMETER MAPS

CROSS-REFERENCE TO RELATED APPLICATIONS

This application represents the national stage entry of International Application PCT/US2017/012677 filed Jan. 9, 2017, which claims the benefit of U.S. Provisional Patent Application 62/276,572, filed on Jan. 8, 2016, and entitled "SYSTEM AND METHOD FOR PRODUCING HIGH-RESOLUTION MAGNETIC RESONANCE RELAXATION PARAMETER MAPS."

BACKGROUND

The field of the present disclosure is systems and methods for magnetic resonance imaging ("MRI"). More particularly, the present disclosure relates to systems and methods for calibrating magnetic resonance images to produce high-resolution maps of relaxation parameters, such as longitudinal or transverse relaxation times.

Cardiovascular disease is the leading global cause of death, accounting for 17.3 million deaths per year. Fibrosis is an important marker in many types of heart disease, including ischemic heart disease, atrial fibrillation, cardiac amyloidosis, cardiomyopathy, myocarditis, and aortic stenosis. Therefore, the ability to characterize and quantify the three-dimensional architecture of fibrosis in the heart is of much clinical interest.

The ability to characterize the three-dimensional architecture of the scar tissue area is of much interest in the field of cardiology. Current methods in the field to detect scar tissue and delineate areas of tissues with different characteristics are laborious and have several limitations. Myocardial viability based on electrical voltage of the tissue is highly dependent on catheter orientation and contact to tissue. Furthermore, the ability to properly identify tissue types outside of dense scar are even more difficult because thresholds for voltage collected by catheters used for scar analysis are variant between patients. Electrical pacing from catheters in-vivo has been shown to better delineate scar tissue, but this is a time intensive process.

MRI provides the ability to differentiate tissue based on innate tissue characteristics. In particular, parametric mapping, T1-weighted imaging, and T2-weighted imaging have been able to identify changes in tissue stages as a result of acute or chronic inflammatory responses. Transverse relaxation time ("T2") has been mentioned for more acute responses to identify edema; however, the longitudinal relaxation time ("T1") characteristic of tissue has been used for identifying infarct using methods such as delayed enhancement and the modified look-locker inversion recovery ("MOLLI") technique.

Delayed enhancement, also referred to as late gadolinium enhancement ("LGE"), provides a large signal where dense scar tissue has formed based upon a user specified inversion time, at which normal myocardial tissue signal is nulled. This technique provides information of scar tissue in relative signal intensity, which can be difficult to standardize on an individual patient basis because imaging time post contrast and heart rate are uncontrollable variables.

MOLLI imaging directly provides T1 magnetization recovery values for each pixel of the image, with an acquisition time of approximately 10-15 seconds for a 1.3×1.3× 8.0 mm resolution image. Due to the sampling needed at specific time points to acquire this data (in addition to the regular difficulties of cardiac imaging such as patient motion, breathing, magnetic field inhomogeneity), this can make it difficult to use the MOLLI sequence for evaluation of T1 tissue evaluation. The acquisition of multiple sample points along the T1 recovery curve makes it difficult to achieve sub-millimeter or close to sub-millimeter isotropic resolution.

Thus, there remains a need for a robust method that can provide high resolution T1 images for use in fully understanding the complexity of fibrotic tissue in patients with ischemic and non-ischemic cardiomyopathies.

SUMMARY OF THE DISCLOSURE

The present disclosure addresses the aforementioned drawbacks by describing a method for producing a map of a relaxation parameter from images acquired with a magnetic resonance imaging ("MRI") system. The method includes providing, to a computer system, an image of a subject acquired with an MRI system. A low-resolution relaxation parameter map of the subject is also provided to the computer system. The low-resolution relaxation parameter map has a lower spatial resolution than the provided image of the subject. The computer system is used to compute a calibration curve that relates image intensity values in the provided image of the subject to relaxation parameter values in the low-resolution relaxation parameter map. A high-resolution relaxation parameter map of the subject, which has the same spatial resolution as the provided image of the subject, is then produced by converting the image intensity values in the provided image of the subject to relaxation parameter values using the calibration curve.

The foregoing and other aspects and advantages of the present disclosure will appear from the following description. In the description, reference is made to the accompanying drawings that form a part hereof, and in which there is shown by way of illustration a preferred embodiment. This embodiment does not necessarily represent the full scope of the invention, however, and reference is therefore made to the claims and herein for interpreting the scope of the invention.

DETAILED DESCRIPTION

Figure 1:
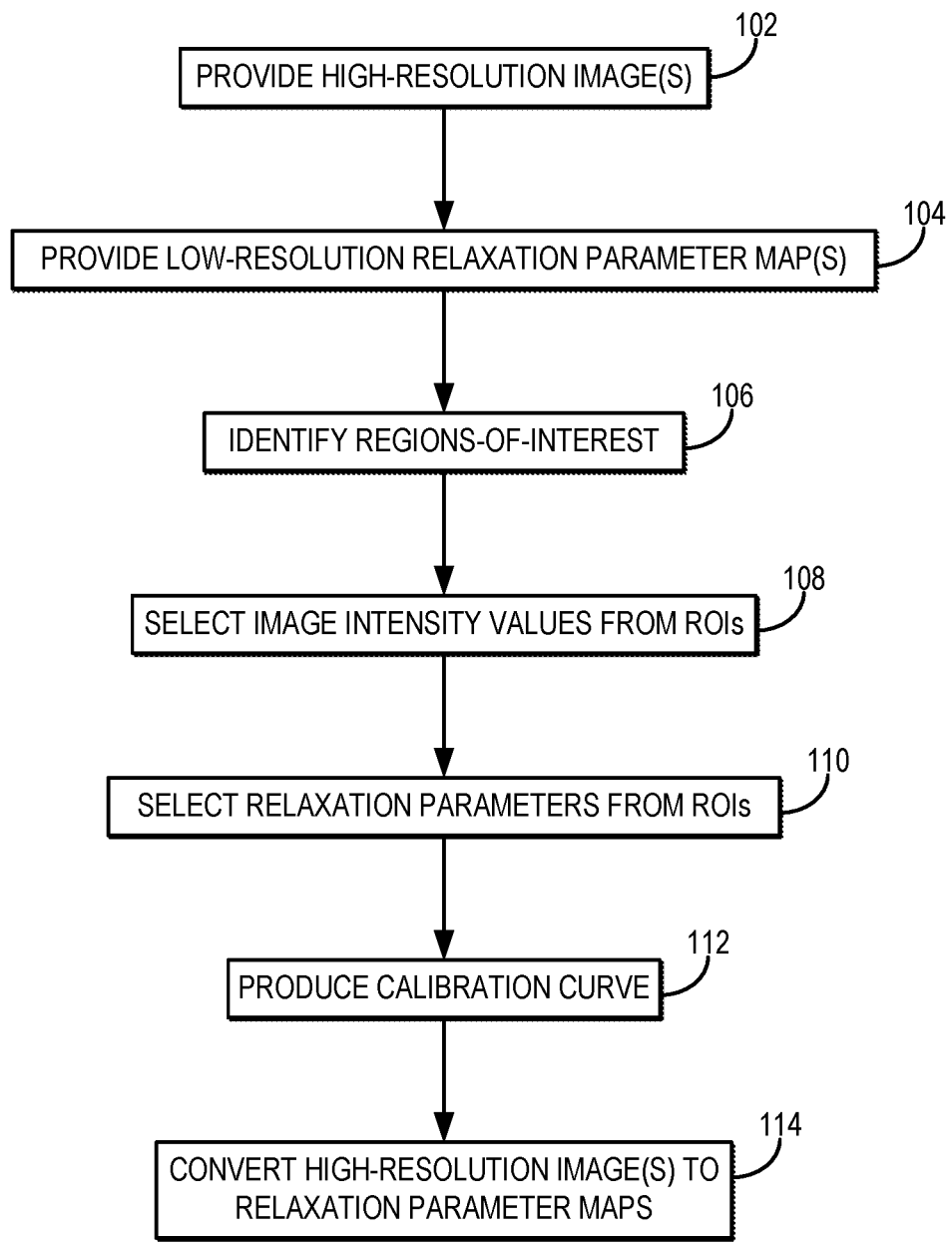
FIG. 1 is a flowchart setting forth the steps of an example method for generating a high-resolution relaxation parameter map using a calibration procedure that converts high-resolution magnetic resonance images into the relaxation parameter maps.

Described here are systems and methods for producing high-resolution three-dimensional ("3D") relaxation parameter maps by calibrating high-resolution 3D magnetic resonance images. As one example, high-resolution longitudinal relaxation time ("T1") maps can be generated based on images acquired using a T1-weighted pulse sequence, and as another example high-resolution transverse relaxation time ("T2") maps can be generated based on images acquired using a T2-weighted pulse sequence. The high-resolution images can be calibrated, for example, using a lower resolution single slice relaxation parameter map. The methods described here utilize high-resolution 3D scans and low-resolution relaxation parameter maps that are commonly available on MRI systems. The calibration is a post-processing step used to create the high-resolution 3D relaxation parameter maps from these two types of scans.

The systems and methods described here include converting high-resolution 3D images to high-resolution relaxation parameters maps by a calibration from a relaxation parameter map obtained using currently available low-resolution methods. As mentioned above, one example is producing high-resolution T1 maps from T1-weighted images and a low resolution T1 map. An example of a T1-weighted image pulse sequence is the 3D-phase inversion recovery ("PSIR"). An example of a currently used low-resolution T1-mapping method is the Modified Look-Looker Inversion Recovery ("MOLLI"). The two sets of images can be obtained in either native or post-contrast conditions. Obtaining both native and post-contrast T1 maps allows the calculation of extracellular volume fraction, a physiological marker of fibrosis and edema.

In general, the calibration process involves obtaining relaxation parameter values from different tissue types (e.g., blood, myocardium, liver) from the low-resolution relaxation parameter maps and the signal intensity values from the corresponding locations in the high-resolution signal intensity T1-weighted images. An exponential decay curve is then fitted to data points of relaxation parameters versus signal intensity values. This calibration curve is then used to convert all the signal intensity values of the high-resolution images to relaxation parameter values.

The methods described here can advantageously provide high-resolution relaxation parameter maps for multiple different clinical applications. In one example, ischemic heart disease can be assessed by providing high-resolution T1 mapping that has the potential to detect tissue injury within, and remote to, scar tissue. In another example, atrial fibrillation can be assessed by providing high-resolution T1 mapping that has the potential to detect diffuse fibrosis in thin atrial walls. Fibrosis in the atrium is linked to reduced ablation success; thus, by providing an imaging tool capable of monitoring fibrosis at a submillimeter level, the efficacy of an ablative procedure can be assessed even better. In another example, cardiac amyloidosis can be assessed by providing high-resolution T1 mapping that can help detect early indications of disease in ventricular muscle. As still another example, cardiomyopathy can be assessed by providing high-resolution T1 mapping and extracellular volume fraction calculation, which can help risk stratify patients with hypertrophic cardiomyopathy. In another example, myocarditis can be assessed by providing high-resolution T1 mapping that can help detect acute myocarditis. And, in another example, aortic stenosis can be assessed by providing high-resolution T1 mapping that can detect diffuse fibrosis resulting from aortic stenosis before the manifestation of symptoms in the patient.

Referring now to FIG. 1, a flowchart is illustrated as setting forth the steps of an example method for producing a high-resolution relaxation parameter map using a calibration procedure that converts high-resolution magnetic resonance images into relaxation parameter maps with the same spatial resolution as the high-resolution images.

The method this includes providing high-resolution magnetic resonance images of a subject, as indicated at step 102. As one example, the high-resolution magnetic resonance images are provided to a computer system by retrieving previously acquired images from a data storage. As another example, the high-resolution magnetic resonance images are provided to a computer system by acquiring the images with an MRI system. In this example, the computer system may be an operator or networked workstation connected to the MRI system.

In general, the high-resolution magnetic resonance images are images that are weighted with respect to the relaxation parameter for which high-resolution parameter maps will be generated. For instance, if high-resolution T1 maps are desired, then the magnetic resonance images will preferably be T1-weighted images. Likewise, if high-resolution T2 maps are desired, then the magnetic resonance images will preferably be T2-weighted images. In some embodiments, the high-resolution magnetic resonance images can be obtained following the administration of a contrast agent, such as a gadolinium-based contrast agent or a superparamagnetic iron oxide ("SPIO")-based contrast agent, to the subject.

As one specific, non-limiting example, the high-resolution magnetic resonance images can be T1-weighted images acquired using a 3D-PSIR pulse sequence during late gadolinium enhancement ("LGE"). Imaging during LGE is a routinely used clinical scan that can be used to detect fibrotic tissue, and using 3D-PSIR pulse sequence for this purpose advantageously highlights areas that are hyper-enhanced after contrast administration, which represents fibrotic and damaged tissue. The 3D-PSIR sequence is an inversion recovery prepared spoiled gradient echo sequence. This particular pulse sequence implements a constant low flip angle, α, tipping of the magnetization during the magnetization recovery. The use of a short echo time ("TE") and a short repetition time ("TR") of the 3D-PSIR pulse sequence results in T1-weighted images, which can be used for the techniques described here.

Data acquisition for the 3D-PSIR sequence occurs during a series of low flip angle, α, (or "alpha") pulses. After each alpha pulse, during the magnetic resonance signal measurement there is a spin-lattice, or longitudinal, relaxation leading to, $$m = K \cdot [H] \cdot \left(1 + (m_i \cos(\alpha) - 1)e^{-\frac{TR}{T1}}\right). \tag{1}$$

In an inversion recovery experiment where the starting magnetization value is $m_0 = -1$, Eqn. (1) becomes, $$m = K \cdot [H] \cdot \left(m_\infty - (1 + m_\infty)\left(\cos(\alpha) \cdot e^{-\frac{TR}{T1}}\right)^i\right); \tag{2}$$

where $m_i$ is the magnetization represented at time $t = i \cdot TR$, which is the $i^{th}$ repetition time period and [H] is proton density. The steady state magnetization, $m_\infty$, equals, $$m_\infty = \frac{1 - e^{-\frac{TR}{T1}}}{1 - \cos(\alpha) \cdot e^{-\frac{TR}{T1}}}. \tag{3}$$

Eqn. (3) represents the longitudinal magnetization just before each RF pulse. During the steady state, there is not much deviation in the amplitude of the longitudinal magnetization during each magnetization flip caused by the alpha pulse. Eqn. (3) can be further simplified into a three-parameter exponential model based on assumptions of a long inversion repletion time and a small flip angle.

Referring again to FIG. 1, the method also includes providing a low-resolution relaxation parameter map, as indicated at step 104. The relaxation parameter map is "low-resolution" in the sense that it has lower spatial resolution than the high-resolution magnetic resonance images provided in step 102. As one non-limiting example, the high-resolution images can have a spatial resolution on the order of 1.2×1.2×1.2 mm, whereas in many cases the relaxation parameter maps have a spatial resolution on the order of 1.3×1.3×8.0 mm.

Like the high-resolution images, the relaxation parameter map can be provided to computer system by retrieving the map from a data storage, or by generating such a map based on magnetic resonance images or data acquired with an MRI system. As stated above, the type of relaxation parameter map that is provided will depend on the desired type of high-resolution relaxation parameter map. That is, a low-resolution T1 map is provided when a high-resolution T1 map is desired, and a low-resolution T2 map is provided when a high-resolution T2 map is desired.

As one specific, non-limiting example, the relaxation parameter map can be a T1 map generated based on images or data acquired using a modified look-locker inversion recovery ("MOLLI") pulse sequence. For instance, a MOLLI pulse sequence with a standard 3(3)3(3)5 acquisition scheme can be used, in which three inversion experiments are performed with data acquisition occurring at an inversion time of 100 milliseconds, 200 milliseconds, and 350 milliseconds, respectively, after each inversion pulse. A series of eleven images can be acquired in a single breath hold using this technique. A quantitative T1 map can be generated based on the images acquired with this MOLLI pulse sequence, as would be appreciated by those skilled in the art.

Referring again to FIG. 1, the method proceeds by generating calibration information for converting the high-resolution magnetic resonance images to high-resolution, quantitative relaxation parameter maps. Although this process can be performed globally across the field-of-view, in some preferred embodiments the processing is performed based on information from target regions-of-interest ("ROIs"). This, regions-of-interest can be identified, as indicated at step 106. For instance, ROIs can be identified in the high-resolution images. As an example, the ROIs can be identified as containing particular tissue types. In some embodiments, it is preferable to select the ROIs to correspond to a range of different tissue types each having different expected relaxation parameters.

As one example for cardiac imaging applications, ROIs can be drawn on normal myocardium, blood pool, and liver. For the normal myocardium, an anterior septal and posterior lateral location can be used to place ROIs to identify normal myocardium. Blood pool ROIs can be placed in the apical, mid, and basal locations within the left ventricle. The ROI in the liver can be drawn close to the posterior lateral border of the left ventricle.

Image intensity values in the high-resolution image are then selected from the ROIs, as indicated at step 108. Similarly, as indicated at step 110, image values from the low-resolution relaxation parameter map are also selected from the same ROIs. The image values in the low-resolution relaxation parameter map correspond to quantitative values of the particular relaxation parameter.

Figure 2:
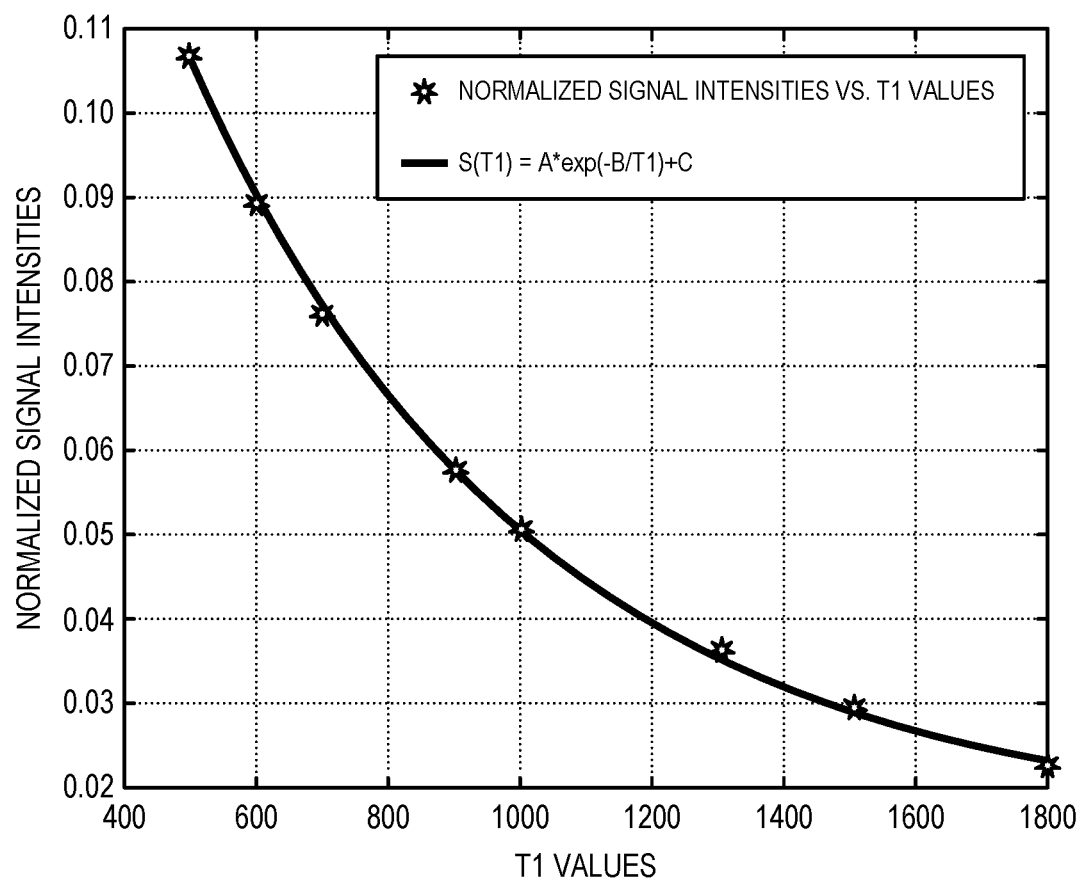
FIG. 2 is an example of a calibration curve useful for converting magnetic resonance image intensity values to quantitative relaxation parameter values.

The image intensity values and the relaxation parameter values are then used to produce a calibration curve, or other calibration information, as indicated at step 112. For instance, the signal intensity information from the high-resolution images and the relaxation parameter values from the relaxation parameter map can be provided to a least squares fit using an exponential decay equation. An example calibration curve is illustrated in FIG. 2.

This processing creates a one-to-one relationship between the relaxation parameter and relative signal intensity using the data collected from the selected tissues in the high-resolution images. As mentioned above, in some preferred embodiments, a range of tissues with relatively high and relatively low relaxation parameters can be chosen to provide a more robust calibration curve. It is contemplated that as few as five data points can be used to produce a robust calibration curve. As one specific and non-limiting example, the exponential decay equation can be the following, $$S(T1) = Ae^{-\frac{B}{T1}} + C; \quad (4)$$

where S(T1) represents the relative signal intensity based on the high-resolution images (i.e., the image intensity values from those images) and T1 represents the associated T1 recovery values associated with the relaxation parameter map. Least squares estimates of parameters A, B, and C can be obtained using an appropriate numerical solver, such as the Levenberg-Marquardt algorithm and given constraints based on the expected theoretical relationship between T1 and the signal intensity ("SI"). Similarly, when the relaxation parameter of interest is T2, the following equation can be used:

$$S(T2) = Ae^{-\frac{B}{T2}} + C. \quad (5)$$

The calibration curve, or other calibration information, is then used to convert the image intensity values in the high-resolution images to relaxation parameter values, thereby creating high-resolution relaxation parameter maps, as indicated at step 114. As one example, the parameters A, B, and C determined above can be used to form a signal calibration curve based on Eqn. (4), which can then be used to convert image intensity values in the high-resolution images to T1 values according to, $$T1 = -\frac{B}{\ln\left(\frac{S(T1) - C}{A}\right)}. \quad (6)$$

These high-resolution relaxation parameter maps can then be displayed or stored in a data storage for later display or further processing. As one example, high-resolution T1 maps can be generated and processed to generate high-resolution maps of other quantitative parameters, such as extracellular volume ("ECV") fraction, which is a quantitative measurement of fibrosis density calculated using pre-contrast and post-contrast T1 maps, and partition coefficient ("PC"), which is described as a ratiometric measurement of the changes of blood T1 over myocardial T1 before and after contrast. High-resolution ECV mapping using the methods described here can provide a useful tool for better understanding of the development of diseases such as hypertrophic cardiomyopathy and aortic stenosis, and for better understanding the initial stages of collagen infiltration.

As one example application, the methods described here can be used to evaluate border zones and gray zones in myocardial tissue. The tissue heterogeneity resulting from fibrosis formation changes the overall myocardial tissue architecture, which creates regions of electrical anisotropy. These regions that are intermixed with collagen and cardiac myocytes are called "gray zones," and are of interest because they have substantial effects on the patient's overall cardiac function, progression of fibrotic disease, and arrhythmogenic zones of tissue. Studies have shown that these gray zone areas are the cause of relentless ventricular arrhythmias in patients, which can exacerbate structural changes and lead to sudden cardiac death. These gray zones represent critical isthmuses of the ventricular arrhythmia circuit, and are characterized by low voltage amplitudes and late activation during sinus rhythm.

Based on previous anecdotal studies, consensus voltage amplitudes of less than 0.5 mV represent completely non-viable tissue, while voltage amplitudes greater than 0.5 mV and less than 1.5 mV represent partially viable tissue, or gray zones. While there are thresholds for voltage amplitudes denoting areas of non-viable tissue and partially viable tissue, each patient may not have the same thresholds and the direction of electrical activation may result in functional viability. It is contemplated that characterizing these gray zones of partially viable tissue using a standardized MRI technique may provide a better understanding of their role in ventricular arrhythmias.

Current methods to characterize these regions are based on various post processing and thresholding techniques of late gadolinium enhancement ("LGE") images. LGE images have been typically used because of the large amount of contrast possible between dense fibrosis and normal myocardium in the image. Parametric T1 maps can also be used to identify areas of fibrosis; however, the acquisition time is longer and a limited spatial resolution exists compared to LGE. The calibration methods described here, however, can address these drawbacks.

ECV and PC provide a physiological method to identify fibrosis formation. Pre-contrast and post-contrast parametric T1 maps are used to measure the ECV along with a hematocrit. This study was undertaken to determine whether gray zones identified by quantitative methods using SI such as FWHM or thresholding had equivalent PCs representing similar cardiac tissue physiology.

As an example, ECV and PC can be computed as follows, $$\Delta R1_{myo} = \frac{1}{T1_{myo,post}} - \frac{1}{T1_{myo,pre}}; \quad (7)$$

$$\Delta R1_{blood} = \frac{1}{T1_{blood,post}} - \frac{1}{T1_{blood,pre}}; \quad (8)$$

$$PC = \frac{\Delta R1_{myo}}{\Delta R1_{blood}}; \quad (9)$$

$$ECV = PC \cdot (1 - HCT); \quad (10)$$

where $T1_{myo,post}$ and $T1_{myo,pre}$ are the T1 values for myocardium from post-contrast and pre-contrast relaxation maps, respectively; $T1_{blood,post}$ and $T1_{blood,pre}$ are the T1 values for blood from post-contrast and pre-contrast relaxation maps, respectively; and HCT is a measurement of hematocrit. Because gadolinium preferentially accumulates in the extracellular space, any myocardial area devoid of cellular space or areas of fibrosis will show an increased amount of gadolinium concentration resulting in a greater decrease in post-contrast T1 values and higher ECV and PC. Ratiometric analysis of T1 eliminates the variability in T1 acquisition techniques, while still providing a quantification of the area of extracellular space in the myocardium.

Post-processing to compute high resolution ECV maps can include a segmentation step. In this step, scar contours are drawn around the myocardium on a single slice of pre-contrast and post-contrast T1-weighted images, preferably on the slice that provided the most optimal long axis image of the infarct. This contour is preferably drawn to encompass the entire area of scar, including normal myocardium, to ensure no regions of dense scar or gray zone would be missed regardless of the gray zone delineation technique used. An additional contour can be drawn in the remote normal myocardium to assess the mean SI for normal myocardium. Using the selected 3D-PSIR images, a high resolution pre-contrast and post contrast 3D T1 map can be created using the technique described above. Using the 3D T1 maps, a high resolution 3D PC map can then be created by a pixel-by-pixel calculation using Eqn. (9).

Pixel-by-pixel designation of the scar contour can then be performed for one or more gray zones, such as the FWHM gray zone, the 3 SD gray zone, and the 6 SD gray zone. Signal intensity thresholds delineating dense scar and gray zone pixels can be determined by using the mean signal intensity of the normal myocardial contour. Full Width Half Maximum ("FWHM"), and standard deviation thresholding (e.g., 3 SD and 6 SD) techniques can be used to stratify pixels in the scar contour into one of three categories: normal tissue ("NT"), gray zone ("GZ"), and dense scar ("DS"). For the FWHM technique, GZ tissue can be determined to be the area within the infarct zone less than 50 percent of the maximum signal intensity of the scar region area. The scar region of interest can be manually drawn in and around the area of highest signal intensity in the LGE image. Three and six standard deviations above the normal myocardial signal intensity can be chosen as thresholds for dense scar, while regions with signal intensity greater than two standard deviations than the normal myocardium, but within the 3 SD or 6 SD threshold, respectively, were designated as peri-infarct zones.

For each pixel stratification method used, the pixels can be categorized based on the LGE signal intensity thresholds for all three tissue types. A 3D PC map can be compared visually and quantitatively to the 3D signal intensity map with color coded pixels representing NT, GZ, and DS.

Although 3D-PSIR and MOLLI pulse sequences were described above, it will be appreciated by those skilled in the art that the methods described here are not limited to using these sequences. For example, other T1 mapping sequences, such as saturation recovery single shot acquisition ("SASHA"), can also be used. Using SASHA can provide benefits such as decreased off-resonance sensitivity, lack of correction for T1 due to the use of saturation pulses rather than inversion pulses, and lack of T2 sensitivity.

Figure 3:
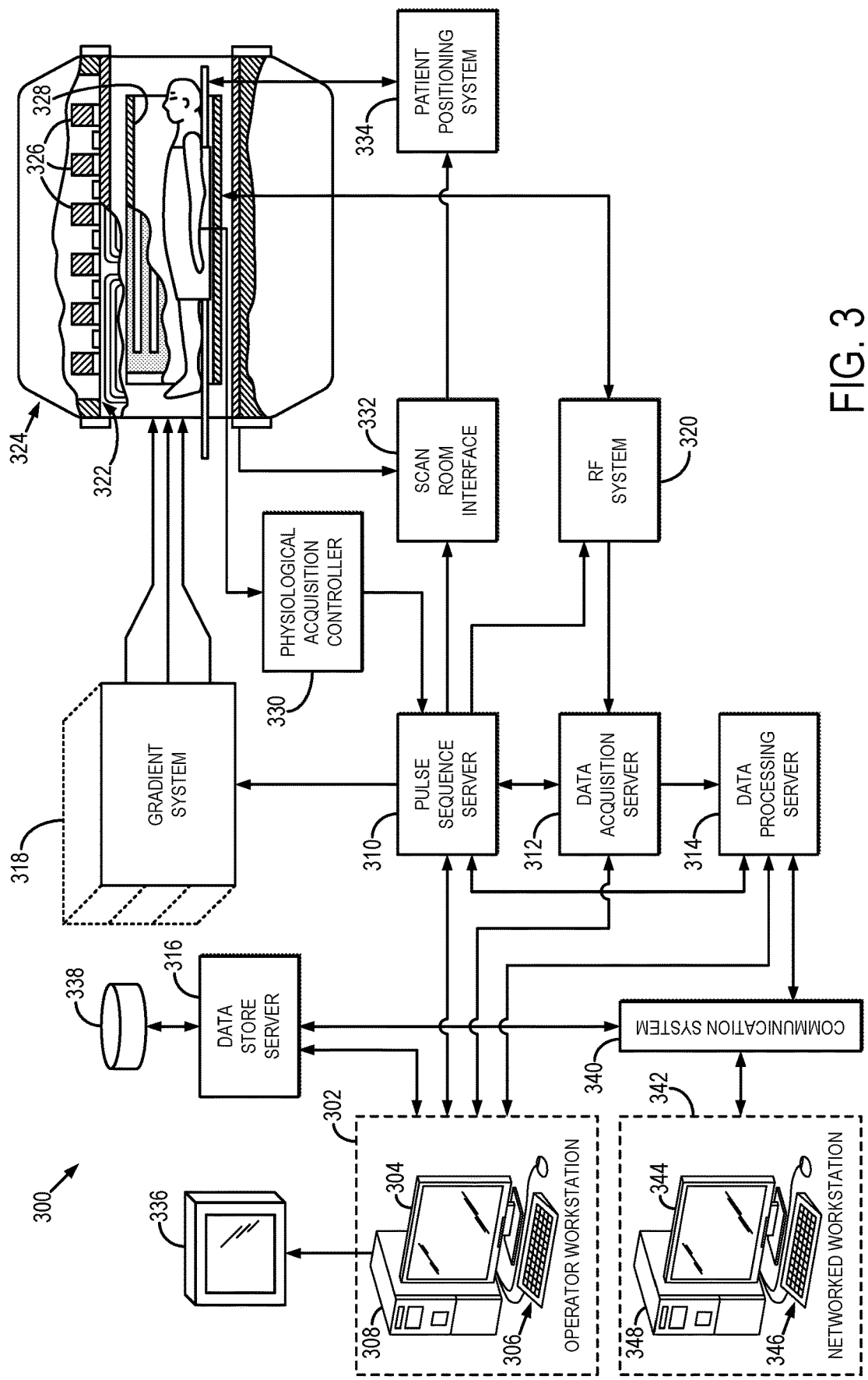
FIG. 3 is a block diagram of an example of a magnetic resonance imaging ("MRI") system.

Referring particularly now to FIG. 3, an example of a magnetic resonance imaging ("MRI") system 300 is illustrated. The MRI system 300 includes an operator workstation 302, which will typically include a display 304; one or more input devices 306, such as a keyboard and mouse; and a processor 308. The processor 308 may include a commercially available programmable machine running a commercially available operating system. The operator workstation 302 provides the operator interface that enables scan prescriptions to be entered into the MRI system 300. In general, the operator workstation 302 may be coupled to four servers: a pulse sequence server 310; a data acquisition server 312; a data processing server 314; and a data store server 316. The operator workstation 302 and each server 310, 312, 314, and 316 are connected to communicate with each other. For example, the servers 310, 312, 314, and 316 may be connected via a communication system 340, which may include any suitable network connection, whether wired, wireless, or a combination of both. As an example, the communication system 340 may include both proprietary or dedicated networks, as well as open networks, such as the internet.

The pulse sequence server 310 functions in response to instructions downloaded from the operator workstation 302 to operate a gradient system 318 and a radiofrequency ("RF") system 320. Gradient waveforms necessary to perform the prescribed scan are produced and applied to the gradient system 318, which excites gradient coils in an assembly 322 to produce the magnetic field gradients $G_x$, $G_y$, and $G_z$ used for position encoding magnetic resonance signals. The gradient coil assembly 322 forms part of a magnet assembly 324 that includes a polarizing magnet 326 and a whole-body RF coil 328.

RF waveforms are applied by the RF system 320 to the RF coil 328, or a separate local coil (not shown in FIG. 3), in order to perform the prescribed magnetic resonance pulse sequence. Responsive magnetic resonance signals detected by the RF coil 328, or a separate local coil (not shown in FIG. 3), are received by the RF system 320, where they are amplified, demodulated, filtered, and digitized under direction of commands produced by the pulse sequence server 310. The RF system 320 includes an RF transmitter for producing a wide variety of RF pulses used in MRI pulse sequences. The RF transmitter is responsive to the scan prescription and direction from the pulse sequence server 310 to produce RF pulses of the desired frequency, phase, and pulse amplitude waveform. The generated RF pulses may be applied to the whole-body RF coil 328 or to one or more local coils or coil arrays (not shown in FIG. 3).

The RF system 320 also includes one or more RF receiver channels. Each RF receiver channel includes an RF preamplifier that amplifies the magnetic resonance signal received by the coil 328 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M = \sqrt{I^2 + Q^2} \quad (11);$$

and the phase of the received magnetic resonance signal may also be determined according to the following relationship:

$$\varphi = \tan^{-1}\left(\frac{Q}{I}\right). \quad (12)$$

The pulse sequence server 310 also optionally receives patient data from a physiological acquisition controller 330. By way of example, the physiological acquisition controller 330 may receive signals from a number of different sensors connected to the patient, such as electrocardiograph ("ECG") signals from electrodes, or respiratory signals from a respiratory bellows or other respiratory monitoring device. Such signals are typically used by the pulse sequence server 310 to synchronize, or "gate," the performance of the scan with the subject's heart beat or respiration.

The pulse sequence server 310 also connects to a scan room interface circuit 332 that receives signals from various sensors associated with the condition of the patient and the magnet system. It is also through the scan room interface circuit 332 that a patient positioning system 334 receives commands to move the patient to desired positions during the scan.

The digitized magnetic resonance signal samples produced by the RF system 320 are received by the data acquisition server 312. The data acquisition server 312 operates in response to instructions downloaded from the operator workstation 302 to receive the real-time magnetic resonance data and provide buffer storage, such that no data is lost by data overrun. In some scans, the data acquisition server 312 does little more than pass the acquired magnetic resonance data to the data processor server 314. However, in scans that require information derived from acquired magnetic resonance data to control the further performance of the scan, the data acquisition server 312 is programmed to produce such information and convey it to the pulse sequence server 310. For example, during prescans, magnetic resonance data is acquired and used to calibrate the pulse sequence performed by the pulse sequence server 310. As another example, navigator signals may be acquired and used to adjust the operating parameters of the RF system 320 or the gradient system 318, or to control the view order in which k-space is sampled. In still another example, the data acquisition server 312 may also be employed to process magnetic resonance signals used to detect the arrival of a contrast agent in a magnetic resonance angiography ("MRA") scan. By way of example, the data acquisition server 312 acquires magnetic resonance data and processes it in real-time to produce information that is used to control the scan.

The data processing server 314 receives magnetic resonance data from the data acquisition server 312 and processes it in accordance with instructions downloaded from the operator workstation 302. Such processing may, for example, include one or more of the following: reconstructing two-dimensional or three-dimensional images by performing a Fourier transformation of raw k-space data; performing other image reconstruction algorithms, such as iterative or backprojection reconstruction algorithms; applying filters to raw k-space data or to reconstructed images; generating functional magnetic resonance images; calculating motion or flow images; and so on.

Images reconstructed by the data processing server 314 are conveyed back to the operator workstation 302 where they are stored. Real-time images are stored in a data base memory cache (not shown in FIG. 3), from which they may be output to operator display 302 or a display 336 that is located near the magnet assembly 324 for use by attending physicians. Batch mode images or selected real time images are stored in a host database on disc storage 338. When such images have been reconstructed and transferred to storage, the data processing server 314 notifies the data store server 316 on the operator workstation 302. The operator workstation 302 may be used by an operator to archive the images, produce films, or send the images via a network to other facilities.

The MRI system 300 may also include one or more networked workstations 342. By way of example, a networked workstation 342 may include a display 344; one or more input devices 346, such as a keyboard and mouse; and a processor 348. The networked workstation 342 may be located within the same facility as the operator workstation 302, or in a different facility, such as a different healthcare institution or clinic.

The networked workstation 342, whether within the same facility or in a different facility as the operator workstation 302, may gain remote access to the data processing server 314 or data store server 316 via the communication system 340. Accordingly, multiple networked workstations 342 may have access to the data processing server 314 and the data store server 316. In this manner, magnetic resonance data, reconstructed images, or other data may be exchanged between the data processing server 314 or the data store server 316 and the networked workstations 342, such that the data or images may be remotely processed by a networked workstation 342. This data may be exchanged in any suitable format, such as in accordance with the transmission control protocol ("TCP"), the internet protocol ("IP"), or other known or suitable protocols.

Figure 4:
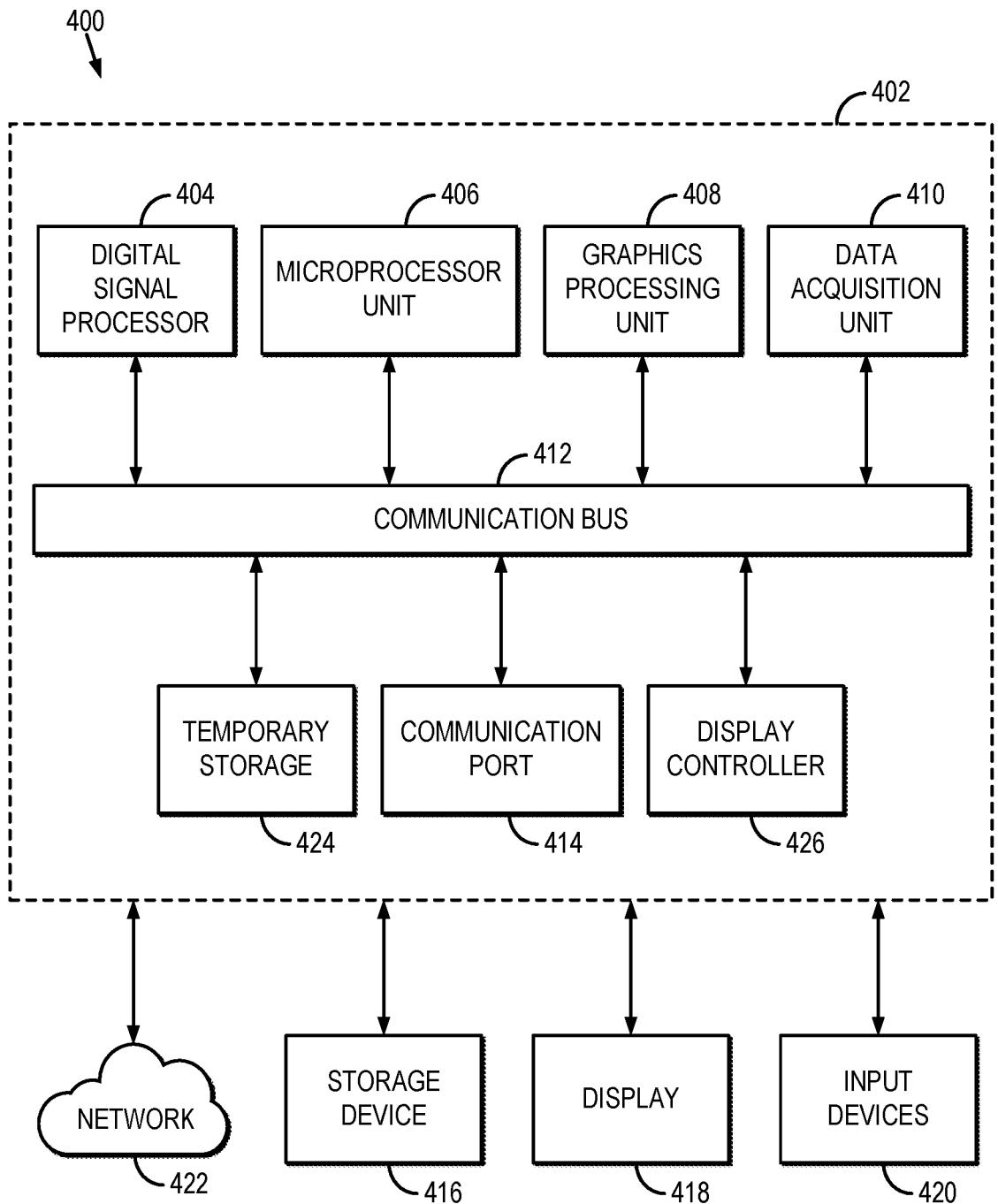
FIG. 4 is a block diagram of an example computer system that can implement the methods described here.

Referring now to FIG. 4, a block diagram of an example computer system 400 that can be configured to implement the methods for producing high-resolution maps of relaxation parameters, such as T1 or T2, is illustrated. Data, such as high-resolution magnetic resonance images and low-resolution relaxation parameter maps, can be provided to the computer system 400 from a data storage device, and these data are received in a processing unit 402.

In some embodiments, the processing unit 402 can include one or more processors. As an example, the processing unit 402 may include one or more of a digital signal processor ("DSP") 404, a microprocessor unit ("MPU") 406, and a graphics processing unit ("GPU") 408. The processing unit 402 can also include a data acquisition unit 410 that is configured to electronically receive data to be processed. The DSP 404, MPU 406, GPU 408, and data acquisition unit 410 are all coupled to a communication bus 412. As an example, the communication bus 412 can be a group of wires, or a hardwire used for switching data between the peripherals or between any component in the processing unit 402.

The DSP 404 can be configured to implement the methods described here. The MPU 406 and GPU 408 can also be configured to implement the methods described here in conjunction with the DSP 404. As an example, the MPU 406 can be configured to control the operation of components in the processing unit 402 and can include instructions to implement the methods for calibrating high-resolution magnetic resonance images to convert those images into high-resolution quantitative maps of relaxation parameters on the DSP 404. Also as an example, the GPU 408 can process image graphics, such as displaying high-resolution magnetic resonance images, low-resolution relaxation parameter maps, and high-resolution relaxation parameter maps.

The processing unit 402 preferably includes a communication port 414 in electronic communication with other devices, which may include a storage device 416, a display 418, and one or more input devices 420. Examples of an input device 420 include, but are not limited to, a keyboard, a mouse, and a touch screen through which a user can provide an input.

The storage device 416 is configured to store data, which may include magnetic resonance images, whether these data are provided to or processed by the processing unit 402. The display 418 is used to display images and other information, such as magnetic resonance images and relaxation parameter maps.

The processing unit 402 can also be in electronic communication with a network 422 to transmit and receive data and other information. The communication port 414 can also be coupled to the processing unit 402 through a switched central resource, for example the communication bus 412.

The processing unit 402 can also include a temporary storage 424 and a display controller 426. As an example, the temporary storage 424 can store temporary information. For instance, the temporary storage 424 can be a random access memory.

The present disclosure has described one or more preferred embodiments, and it should be appreciated that many equivalents, alternatives, variations, and modifications, aside from those expressly stated, are possible and within the scope of the invention.

The invention claimed is:

1. A method for producing a map of a relaxation parameter from images acquired with a magnetic resonance imaging (MRI) system, the steps of the method comprising:
    (a) providing to a computer system, an image of a subject acquired with an MRI system;
    (b) providing to the computer system, a low-resolution relaxation parameter map of the subject, wherein the low-resolution relaxation parameter map has a lower spatial resolution than the provided image of the subject;
    (c) computing with the computer system and using the provided image of the subject and the low-resolution relaxation parameter map, a calibration curve that relates image intensity values in the provided image of the subject to relaxation parameter values in the low-resolution relaxation parameter map;
    (d) producing a high-resolution relaxation parameter map of the subject having the same spatial resolution as the provided image of the subject by converting the image intensity values in the provided image of the subject to relaxation parameter values using the calibration curve.

2. The method as recited in claim 1, wherein step (c) includes computing calibration curve parameters by fitting the image intensity values in the provided image of the subject and the relaxation parameters in the low-resolution relaxation parameter map to an magnetic resonance signal decay model.

3. The method as recited in claim 2, wherein fitting the image intensity values in the provided image of the subject and the relaxation parameters in the low-resolution relaxation parameter map to the magnetic resonance signal decay model includes using a least squares fitting.

4. The method as recited in claim 2, wherein the magnetic resonance signal decay model is, $$S = Ae^{-\frac{B}{T}} + C$$

wherein S are the image intensity values in the provided image of the subject; A, B, and C are the calibration curve parameters; and T is the relaxation parameter depicted in the low-resolution relaxation parameter map.

5. The method as recited in claim 1, wherein step (c) includes selecting a plurality of regions-of-interest (ROIs) and computing the calibration curve parameters based on image intensity values and relaxation parameter values contained in the plurality of ROIs.

6. The method as recited in claim 5, wherein the plurality of ROIs are selected to correspond to different tissue types in the subject.

7. The method as recited in claim 6, wherein the plurality of ROIs are selected to include at least one ROI containing myocardial tissue, at least one ROI containing blood, and at least one ROI containing liver tissue.

8. The method as recited in claim 1, wherein the low-resolution relaxation parameter map is a low resolution longitudinal relaxation time (T1) map, and the high-resolution relaxation parameter map is a high-resolution T1 map.

9. The method as recited in claim 8, wherein the high-resolution magnetic resonance images are magnetic resonance images acquired using an inversion recovery-based pulse sequence.

10. The method as recited in claim 9, wherein the inversion recovery-based pulse sequence is a three-dimensional phase sensitive inversion recovery pulse sequence.

11. The method as recited in claim 8, wherein step (b) includes generating the low-resolution T1 map from images acquired using a modified look-locker inversion recovery pulse sequence.

12. The method as recited in claim 1, wherein the low-resolution relaxation parameter map is a low resolution transverse relaxation time (T2) map, and the high-resolution relaxation parameter map is a high-resolution T2 map.

13. The method as recited in claim 1, further comprising generating a high-resolution quantitative parameter map from the high-resolution relaxation parameter map, wherein the high-resolution quantitative parameter map has the same spatial resolution as the high-resolution relaxation parameter map.

14. The method as recited in claim 13, wherein the high-resolution quantitative parameter map is a high-resolution extracellular volume fraction map having voxels that contain quantitative values of extracellular volume fraction.

15. The method as recited in claim 1, further comprising segmenting the provided image into normal tissue, gray zone, and dense scar regions, such that the high-resolution relaxation parameter map produced in step (d) provides relaxation parameters associated with each of the normal tissue, gray zone, and dense scar regions.

16. The method as recited in claim 15, wherein the gray zone region is generated based on one of a full-width half maximum, a three standard deviation, or a six standard deviation method.

17. The method as recited in claim 15, further comprising generating a high-resolution quantitative parameter map from the high-resolution relaxation parameter map, wherein the high-resolution quantitative parameter map has the same spatial resolution as the high-resolution relaxation parameter map.

18. The method as recited in claim 17, wherein the high-resolution quantitative parameter map is a high-resolution partition coefficient map having voxels that contain quantitative values of partition coefficient.

19. The method as recited in claim 17, wherein the high-resolution quantitative parameter map is a high-resolution extracellular volume fraction map having voxels that contain quantitative values of extracellular volume fraction.

* * * * *